(12) United States Patent
Kwak et al.

(10) Patent No.: US 9,400,425 B2
(45) Date of Patent: Jul. 26, 2016

(54) APPARATUS AND METHOD FOR CLEANING PHOTOMASK

(71) Applicant: AP Systems Inc., Hwaseong, Gyeonggi-Do (KR)

(72) Inventors: Sung Ho Kwak, Gyeonggi-Do (KR); Min Young Cho, Gyeonggi-Do (KR)

(73) Assignee: AP Systems Inc., Hwaseong, Gyeonggi-Do (KR)

( * ) Notice: Subject to any disclaimer, the term of this patent is extended or adjusted under 35 U.S.C. 154(b) by 292 days.

(21) Appl. No.: 14/255,557

(22) Filed: Apr. 17, 2014

(65) Prior Publication Data
US 2014/0345646 A1   Nov. 27, 2014

(30) Foreign Application Priority Data
May 27, 2013   (KR) .................. 10-2013-0059717

(51) Int. Cl.
*B08B 7/00*   (2006.01)
*G03F 1/82*   (2012.01)

(52) U.S. Cl.
CPC ................ *G03F 1/82* (2013.01); *B08B 7/0042* (2013.01)

(58) Field of Classification Search
CPC .............................. B08B 7/0042; G03F 1/82
USPC .......... 134/1, 1.3; 156/345.1, 345.24, 345.39, 156/345.52; 425/174.4; 216/65, 94
See application file for complete search history.

(56) References Cited

U.S. PATENT DOCUMENTS

| 8,182,609 | B1 * | 5/2012 | Le Claire | .............. | B08B 7/0042 134/1 |
| 2008/0264441 | A1 * | 10/2008 | Takagi | ...................... | G03F 1/64 134/1 |
| 2009/0038637 | A1 * | 2/2009 | LeClaire | .............. | B08B 7/0042 134/1 |
| 2012/0219654 | A1 * | 8/2012 | Kim | .......................... | G03F 1/64 425/174.4 |

* cited by examiner

*Primary Examiner* — Saeed T Chaudhry
(74) *Attorney, Agent, or Firm* — Locke Lord LLP; Christopher J. Capelli; Daniel J. Fiorello

(57) ABSTRACT

This invention relates to an apparatus and method for cleaning a photomask. This apparatus, suitable for use in removing an adhesive residue from a photomask, includes a photomask disposed such that a surface thereof on which an adhesive residue is left behind is directed downwards, a metal plate formed adjacent to the adhesive residue, and a laser generator for irradiating a laser onto the metal plate so that the adhesive residue is removed by heat generated from the metal plate.

13 Claims, 3 Drawing Sheets

APPARATUS AND METHOD FOR CLEANING PHOTOMASK

CROSS-REFERENCE TO RELATED APPLICATION

This application claims the benefit of Korean Patent Application No. 10-2013-0059717, filed on May 27, 2013, which is hereby incorporated by reference in its entirety into this application.

BACKGROUND OF THE INVENTION

1. Technical Field

The present invention relates to an apparatus and method for cleaning a photomask, and more particularly to an apparatus for cleaning a photomask and a method of cleaning a photomask using the same, wherein a metal plate is formed adjacent to an adhesive residue and a laser is irradiated onto the metal plate to thus effectively remove the adhesive residue by heat of the metal plate.

2. Description of the Related Art

With the recent trend for high integration and miniaturization of electric and electronic devices, strict process conditions are required. Particularly, it is important that pollution or injection of impurities in devices or apparatuses for use in processes be prevented and thus devices having fine patterns be manufactured so as to be adequate for optimal designs. The most widely useful to form a fine pattern in a device manufacturing process is a photolithography process by which a fine pattern is formed on a corresponding wafer.

Typically, a photolithography process is performed in such a manner that a photoresist is uniformly applied on a wafer, and the pattern of the photomask is exposed and developed, thereby forming a fine pattern of the photomask on the wafer.

In the photolithography process, the case where the photomask has defects or impurities results in defective wafers, which undesirably causes problems such as low productivity and yield of semiconductor devices.

In particular, a final pattern on the wafer by a photolithography process is not completed by only a single exposure process, but is formed by a plurality of exposure processes depending on the pattern or the degree of integration. Such defects of the photomask are regarded as the more important process factor in proportion to an increase in the degree of integration of the device.

Thus, process conditions have to be improved so as not to pollute the photomask, and also, a pellicle is formed on one surface of the photomask so that the photomask itself is not polluted.

The pellicle is formed by being attached to the top of a pellicle frame which has been attached to the upper surface of the non-pattern region of the photomask, and thus functions to prevent direct adsorption of impurities on the photomask and makes it easy to store and manage the photomask.

As such, the pellicle frame is attached to a quartz plate of the photomask using an adhesive. In the case where the pellicle is polluted, when it is removed, the adhesive for attaching the pellicle frame may be left behind on the quartz plate of the photomask, making it difficult to form the pellicle again. Also, when a photolithography process is carried out in a state of the adhesive being left behind without the pellicle, problems such as low exposure, scattering of light, etc. due to a chemical reaction by the adhesive may occur. Hence, it is important that the adhesive be completely removed.

Conventionally, a chemical wet removal process using sulfuric acid is performed to remove the adhesive from the photomask, but the wet solution or residue may still be left behind on the photomask even after removal of the adhesive, and the pattern of the photomask may be damaged due to sulfuric acid.

To solve problems caused by the wet removal process, Korean Patent Application Publication No. 10-2008-0001469 discloses removal of an adhesive residue by removing a pellicle from a photomask, thermally treating the photomask to thus melt the adhesive, and cleaning the photomask using a dilution solution (SC1) of $O_3$, ammonia ($NH_4OH$) and hydrogen peroxide ($H_2O_2$).

However, this method is problematic because heat is directly applied to the photomask, and thus the photomask may become deformed and polluted, and the cleaning solution may be left behind on the surface of the photomask.

To solve problems due to the wet process, thorough research into removal of an adhesive using a dry process as in Koran Patent Application Publication No. 10-2012-0097893 is ongoing recently.

This method is used to directly irradiate a laser onto the pellicle adhesive residue so as to remove the pellicle residue.

Although this method may remove the adhesive residue from the upper surface of chromium (Cr) formed on the photomask, the adhesive organic material existing on the quartz plate is not completely removed.

FIGS. 1A and 1B illustrate the test results using such a prior patent. FIG. 1A illustrates the case where the adhesive residue is left behind on Cr of the photomask, and FIG. 1B illustrates the case where the adhesive residue is left behind just on the quartz plate of the photomask.

As illustrated in these drawings, in the case where the adhesive residue is left behind on Cr, it is removed to a certain extent without damage to Cr after irradiation of a UV laser. However, in the case where the adhesive residue is left behind just on the quartz plate without Cr, even when a UV laser is irradiated, the adhesive residue is never removed. Even at an energy density two times larger than in the test of removing the adhesive residue from the upper surface of Cr, there is no change in adhesive residue. Furthermore, even when several laser irradiations are implemented, no change in adhesive residue occurs.

Therefore, the method of directly irradiating a laser onto the adhesive residue or the quartz plate is disadvantageous because the adhesive residue is not thoroughly removed from the quartz plate.

Also, as a laser is directly irradiated onto the photomask, the range of power of laser usable to prevent damage to the photomask is limited, and thus thorough removal of the adhesive organic material does not occur. Although the laser power has to be increased to completely remove the adhesive organic material, the photomask may be damaged instead.

SUMMARY OF THE INVENTION

Accordingly, the present invention has been made keeping in mind the above problems encountered in the related art, and an object of the present invention is to provide an apparatus and method for cleaning a photomask, wherein a dry cleaning process using a laser to clean the photomask is applied in such a manner that a metal plate is formed adjacent to an adhesive residue and a laser is irradiated onto the metal plate so that the adhesive residue is removed by heat of the metal plate.

In order to accomplish the above object, the present invention provides an apparatus for cleaning a photomask, suitable for use in removing an adhesive residue from a photomask, comprising a photomask disposed such that a surface thereof on which an adhesive residue is left behind is directed downwards, a metal plate formed adjacent to the adhesive residue, and a laser generator for irradiating a laser onto the metal plate so that the adhesive residue is removed by heat generated from the metal plate, and a method of cleaning a photomask using the same.

Also, the metal plate is preferably spaced apart from the adhesive residue by an interval of 50~100 μm, and preferably comprises SUS.

Also, the metal plate is preferably formed in a planar rectangular frame shape corresponding to an attachment region of a pellicle frame to the photomask.

Also, the laser generator is preferably provided such that a laser is irradiated onto the metal plate via a quartz plate from an upside of the photomask, and a suction unit for sucking a vaporization material generated upon removing the adhesive residue by heat generated from the metal plate is preferably further formed adjacent to the metal plate.

Furthermore, the laser is preferably irradiated while moving in a scanning manner along the adhesive residue, and specifically, the laser preferably stays for about 0.05~0.5 sec at the same position while moving at a speed of 0.02~0.07 mm/sec in the scanning manner. Also this procedure is preferably repeated two to ten times depending on the state of the photomask and the adhesive residue.

BRIEF DESCRIPTION OF THE DRAWINGS

FIGS. 1A and 1B illustrate test results for removal of an adhesive residue from a photomask using a laser according to a conventional technique, wherein FIG. 1A illustrates the case where an adhesive residue is left behind on Cr of a photomask, and FIG. 1B illustrates the case where an adhesive residue is left behind just on the quartz plate of a photomask;

DETAILED DESCRIPTION

The present invention addresses an apparatus and method for cleaning a photomask. In particular, the present invention addresses an apparatus and method for cleaning a photomask, wherein a metal plate in response to a laser is formed adjacent to an adhesive residue and thus the adhesive residue is effectively removed by heat of the metal plate without damage to the photomask.

Figure 2:
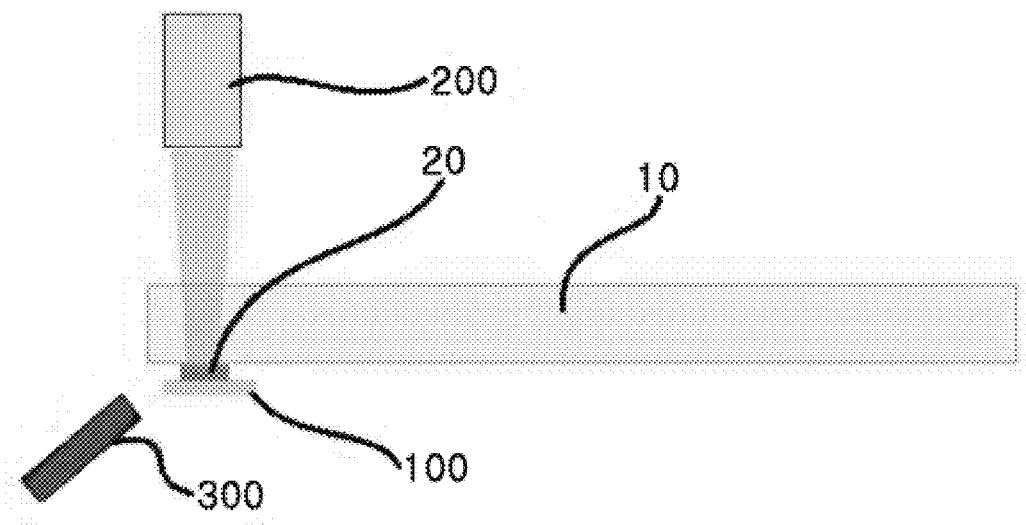
FIG. 2 schematically illustrates main units of an apparatus for cleaning a photomask according to the present invention.
Figure 3:
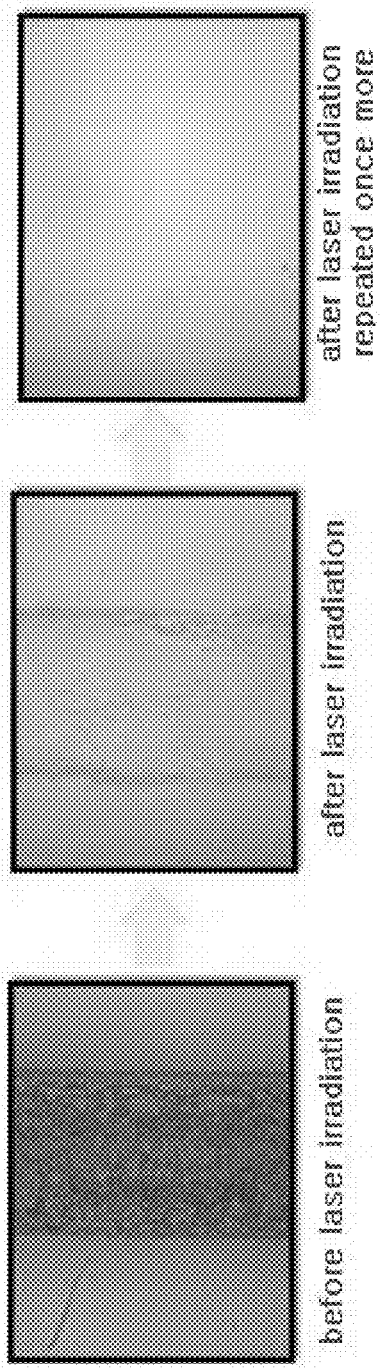
FIG. 3 illustrates test results for removal of an adhesive residue from the upper surface of a photomask according to an embodiment of the present invention.

Hereinafter, a detailed description will be given of the present invention with reference to the appended drawings. FIG. 2 schematically illustrates main units of an apparatus for cleaning a photomask according to the present invention, and FIG. 3 illustrates test results for removal of an adhesive residue from a photomask according to an embodiment of the present invention.

As illustrated in these drawings, the apparatus for cleaning a photomask according to the present invention plays a role in removing an adhesive residue from a photomask 10, and includes a photomask 10 disposed such that a surface thereof on which an adhesive residue 20 is left behind is directed downwards, a metal plate 100 formed adjacent to the adhesive residue 20, and a laser generator 200 for irradiating a laser onto the metal plate 100 so that the adhesive residue 20 is removed by heat generated from the metal plate 100.

In the present invention, the photomask 10 is used for a photolithography process to form a fine pattern on a wafer in a semiconductor device process, and in particular, the photomask 10 polluted during the process is intended to be cleaned.

Especially when a pellicle is formed to prevent pollution of the photomask 10 and then removed after performing the process, the adhesive residue 20 may be left behind on the surface of the photomask 10. In the present invention, the photomask 10 having the adhesive residue 20 left behind on the surface thereof has to be cleaned.

Typically, the photomask 10 has a pattern formed using Cr on a quartz plate, and a predetermined pattern is formed on a wafer by uniformly forming a photoresist layer on a wafer, adjusting a focal distance depending on the size of the pattern to be formed on the wafer, and performing exposure and development.

The photosensitive material contained in the photoresist of the photoresist layer may be a negative type where the photoresist of the non-exposed portion is removed or a positive type where the photoresist of the exposed portion is removed, and the type thereof is appropriately selected depending on the final pattern on the wafer.

In this case, the Cr pattern formed on the photomask 10 has different pattern and non-pattern regions depending on the negative type or the positive type. In the case of the negative type, the Cr pattern region is formed at the center, and the non-pattern region is formed using Cr therearound. Whereas, in the case of the positive type, the Cr pattern region is formed only at the center and the non-pattern region comprising only the quartz plate without Cr is formed therearound.

As mentioned above, the pellicle is formed to prevent pollution of the photomask 10. Depending on the negative type or the positive type, the adhesive residue 20 left behind after removal of the pellicle may be formed just on the quartz plate, or may be formed on Cr.

In the present invention, the photomask 10 having the adhesive residue 20 left behind thereon includes all the cases as above. Unlike a conventional technique, the present invention is advantageous because the adhesive residue 20 may be effectively removed not only when the adhesive residue 20 is left behind just on the quartz plate but also when the adhesive residue 20 is left behind on Cr.

The photomask 10 is disposed such that its surface on which the adhesive residue 20 is left behind is directed downwards.

As such, the reason why the photomask 10 is disposed in such a manner that its surface on which the adhesive residue 20 is left behind is directed downwards is that, in the case where the process of removing the adhesive residue 20 is performed, the removed adhesive residue 20 is not dropped again on the photomask 10.

The metal plate 100 is disposed adjacent to the adhesive residue 20 under the photomask 10, and the laser generator 200 for irradiating a laser onto the metal plate 100 is disposed so that the adhesive residue 20 is removed by heat generated from the metal plate 100.

The metal plate 100 is made of a metal which responds to a laser, especially a metal which absorbs energy of a laser to thus increase its surface temperature. Particularly useful is SUS in consideration of processability and profitability.

The metal plate 100 is formed adjacent to the adhesive residue 20, provided that it does not come into contact with the adhesive residue 20. It is preferably spaced apart from the adhesive residue 20 by an interval of 50~100 μm.

When the metal plate 100 comes into contact with the adhesive residue 20 or is spaced apart by an interval less than 50 μm, remnants in the course of vaporization of the adhesive may be attached to the metal plate 100, undesirably incurring secondary pollution of the metal plate 100 and the photomask 10.

In contrast, if the metal plate is spaced apart by an interval more than 100 μm, heat transfer efficiency of the metal plate 100 may decrease, undesirably lowering the total removal efficiency of the adhesive residue 20.

Hence, the interval between the metal plate 100 and the adhesive residue 20 is properly set to 50~100 μm.

Also, the metal plate 100 is preferably provided in the form of a planar rectangular frame shape corresponding to the attachment region of the pellicle frame to the photomask 10.

Typically upon forming a pellicle, a pellicle frame is attached to the upper surface of the photomask 10 using an adhesive. Because the adhesive residue 20 may be left behind upon removal of the pellicle, when the metal plate 100 is provided in the form of a planar rectangular frame shape corresponding to the attachment region of the pellicle frame, a laser may be efficiently irradiated onto the metal plate 100.

Specifically, when the metal plate 100 is provided in the form of a rectangular frame shape corresponding to the attachment region of the pellicle frame (the region where the adhesive residue 20 is left behind) in this way, the adhesive residue 20 may be completely removed only by way of laser scanning without movement of the metal plate 100.

The laser generator 200 is preferably provided such that a laser is irradiated onto the metal plate 100 via the quartz plate from the upside of the photomask 10. The case where a laser may be directly irradiated onto the metal plate 100 from the downside of the photomask 10 is possible. If so, however, the remnant of the adhesive residue 20 may be dropped down, and also, it is not easy to dispose the laser generator 200 under the photomask 10.

The laser of the laser generator 200 is focused and irradiated on the metal plate 100 and thus most of the laser energy is transferred to the metal plate 100, and the laser is transferred in a very small amount to the quartz plate while passing through the quartz plate. In this case, the quartz plate is partially warmed, and thus the adhesive residue 20 may be more quickly and efficiently removed.

Hence, it is preferred that the laser of the laser generator 200 be irradiated onto the metal plate 100 via the quartz plate from the upside of the photomask 10.

Also, a suction unit 300 for sucking a vaporization material generated upon removal of the adhesive residue 20 by heat generated from the metal plate 100 is further formed adjacent to the metal plate 100.

The suction unit 300 functions to suck a vaporization material or remnant generated upon removal of the adhesive residue 20, and includes a suction port for vacuum suction of not only peripheral gases but also vaporization and liquefaction materials or remnants caused by removal of the adhesive residue 20, thus preventing re-pollution of the photomask 10.

Below is a description of the method of cleaning the photomask 10 according to the present invention using the apparatus for cleaning the photomask 10 as above, and a redundant description thereof is omitted.

The method of cleaning the photomask 10 according to the present invention includes (1) disposing a photomask 10 such that a surface thereof on which an adhesive residue 20 is left behind is directed downwards, (2) positioning a metal plate 100 adjacent to the adhesive residue 20, and (3) irradiating a laser onto the metal plate 100 so that the adhesive residue 20 is removed by heat generated from the metal plate 100.

In step (2), the interval between the metal plate 100 and the adhesive residue 20 is preferably set to 50~100 μm as above, and the metal plate 100 is preferably made of SUS.

In step (3), the laser is irradiated onto the metal plate 100 via the quartz plate from the upside of the photomask 10, and specifically, it is irradiated while moving in a scanning manner along the adhesive residue 20, thus continuously removing the adhesive residue 20.

As mentioned above, the laser is irradiated while moving in a scanning manner along the metal plate 100 which is provided in the form of a rectangular frame shape corresponding to the shape of the attachment region of the pellicle frame, namely, the region where the adhesive residue 20 is left behind.

Specifically, the laser is irradiated onto the metal plate 100 in a way that stays for about 0.05~0.5 sec at the same position while moving at a line width of about 0.02~0.06 μm and a speed of 0.02~0.07 mm/sec in a scanning manner. Thereby, the irradiation speed and time of the laser are set to the extent that the metal plate 100 absorbs energy of the irradiated laser and is heated somewhat and thus such heat is transferred to the adhesive residue 20 to thereby vaporize the adhesive residue 20.

Also, step (3) may be repeated two to ten times depending on the state of the adhesive residue 20, for example, the width, height or kind of the adhesive residue 20, and thereby the adhesive residue 20 may be completely removed from the upper surface of the photomask 10.

Below, an embodiment of the prevent invention is described.

A photomask having an adhesive residue left behind just on a quartz plate after removal of the pellicle was prepared. The photomask was disposed such that the adhesive residue was directed downwards, and a metal plate was spaced apart from the adhesive residue by an interval of 85 μm.

A green laser (515 nm, 10 kHz) was irradiated at a dose of 4.3 J/cm$^2$ for 0.1 sec. Specifically, a laser was irradiated while moving in a scanning manner under conditions of a beam size of 4 mm×0.04 mm and a speed of 0.5 mm/sec. It stayed for about 0.1 sec at the same position. This procedure was repeated two times under the same conditions.

Figure 1:
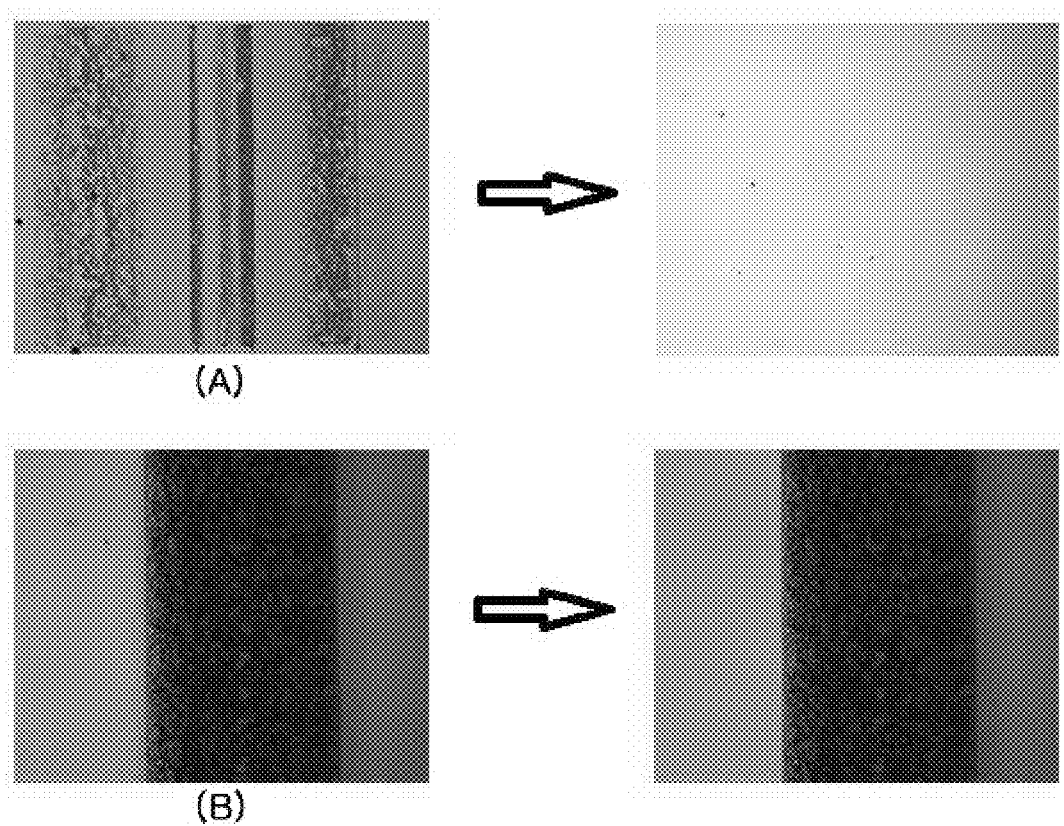

FIG. 3 illustrates the test results for removal of the adhesive residue from the upper surface of the photomask in the above embodiment (the first shows an image before laser irradiation, the second shows an image after one laser irradiation, and the third shows an image after two laser irradiations). As illustrated in the drawing, compared to the conventional test results for removal of the adhesive residue from the upper surface of the photomask (FIGS. 1A and 1B), removal of the adhesive residue from the upper surface of the photomask according to the present invention is more efficient, and the photomask may be thoroughly cleaned.

As described hereinbefore, the present invention provides an apparatus and method for cleaning a photomask. According to the present invention, a laser is not directly irradiated onto a photomask, but is irradiated onto a metal plate which is formed adjacent to an adhesive residue, and thereby the adhesive residue can be efficiently and rapidly removed, and the adhesive residue can be effectively removed without damage to the photomask.

Also, the adhesive residue can be thoroughly removed regardless of the Cr pattern or the quartz plate of the photomask.

What is claimed is:

1. An apparatus for cleaning a photomask, suitable for use in removing an adhesive residue from a photomask, comprising:
   a photomask disposed such that a surface thereof on which an adhesive residue is left behind is directed downwards;
   a metal plate formed adjacent to the adhesive residue; and a laser generator for irradiating a laser onto the metal plate so that the adhesive residue is removed by heat generated from the metal plate.

2. The apparatus of claim 1, wherein the metal plate is spaced apart from the adhesive residue by an interval of 50~100 μm.

3. The apparatus of claim 1, wherein the metal plate comprises SUS.

4. The apparatus of claim 1, wherein the metal plate is formed in a planar rectangular frame shape corresponding to an attachment region of a pellicle frame to the photomask.

5. The apparatus of claim 1, wherein the laser generator is provided such that a laser is irradiated onto the metal plate via a quartz plate from an upside of the photomask.

6. The apparatus of claim 1, wherein a suction unit for sucking a vaporization material generated upon removing the adhesive residue by heat generated from the metal plate is further formed adjacent to the metal plate.

7. A method of cleaning a photomask, suitable for use in removing an adhesive residue from a photomask, comprising:
   1) disposing a photomask such that a surface thereof on which an adhesive residue is left behind is directed downwards;
   2) positioning a metal plate adjacent to the adhesive residue; and
   3) irradiating a laser onto the metal plate so that the adhesive residue is removed by heat generated from the metal plate.

8. The method of claim 7, wherein in 2), an interval between the metal plate and the adhesive residue is 50~100 μm.

9. The method of claim 7, wherein the metal plate comprises SUS.

10. The method of claim 7, wherein in 3), the laser is irradiated while moving in a scanning manner along the adhesive residue.

11. The method of claim 10, wherein the laser stays for about 0.05~0.5 sec at the same position while moving at a speed of 0.02~0.07 mm/sec in the scanning manner.

12. The method of claim 7, wherein 3) is repeated two to ten times.

13. The method of claim 7, wherein the laser is irradiated onto the metal plate via a quartz plate from an upside of the photomask.

* * * * *